United States Patent
Gao (10) Patent No.: US 11,925,001 B2
(45) Date of Patent: Mar. 5, 2024

(54) HIGH POWER DENSITY CHIPS BASED TWO-PHASE LOOP RECIRCULATION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 59 days.

(21) Appl. No.: 17/700,960

(22) Filed: Mar. 22, 2022

(65) Prior Publication Data

US 2023/0309263 A1 Sep. 28, 2023

(51) Int. Cl.
*H05K 7/20* (2006.01)
*H01L 23/427* (2006.01)

(52) U.S. Cl.
CPC ....... *H05K 7/20327* (2013.01); *H01L 23/427* (2013.01); *H05K 7/20309* (2013.01); *H05K 7/20509* (2013.01); *H05K 7/20809* (2013.01)

(58) Field of Classification Search
CPC .......... H05K 7/20309; H05K 7/20327; H05K 7/20509; H05K 7/20809; H01L 23/427
See application file for complete search history.

(56) References Cited

U.S. PATENT DOCUMENTS

| | | | | |
|---|---|---|---|---|
| 4,470,450 A * | 9/1984 | Bizzell | ................. | F28D 15/043 165/104.33 |
| 5,810,074 A * | 9/1998 | Hancock | .................. | F28F 9/26 96/204 |
| 9,468,132 B2 * | 10/2016 | Taguchi | ............. | H05K 7/20209 |
| 10,014,239 B2 * | 7/2018 | Takemura | ............... | H01L 23/42 |
| 10,966,354 B1 * | 3/2021 | Shao | ........................ | F28D 15/00 |
| 2020/0113083 A1 * | 4/2020 | Schon | ................ | H05K 7/20327 |
| 2020/0113085 A1 * | 4/2020 | Schon | ..................... | F25D 17/02 |
| 2022/0418166 A1 * | 12/2022 | Chen | .................. | H05K 7/20809 |
| 2023/0309270 A1 * | 9/2023 | Gao | ................... | H05K 7/20309 361/700 |

* cited by examiner

*Primary Examiner* — Robert J Hoffberg
(74) *Attorney, Agent, or Firm* — WOMBLE BOND DICKINSON (US) LLP (57) ABSTRACT

An electronic cooling system is disclosed. The system includes a plurality of cooling plates to extract heat from their respective heat sources. The system further includes one or more vapor separators for extracting vapor from the liquid, with each vapor separator to receive mixed phase liquid and separate the mixed phase liquid into vapor and cooling liquid. The system further includes a return unit to receive the vapors from the vapor separators through one or more vapor loops, and dissipate the received vapors to an external cooling loop. The cooling plates include a first cooling plate that receives liquid phase cooling liquid to extract heat from a first heat source and produces first mixed phase liquid. The cooling plates further include a second cooling plate that uses cooling liquid from a vapor separator to extract heat from a second heat source, produces second mixed phase liquid, and supplies the second mixed phase liquid to the return unit.

20 Claims, 7 Drawing Sheets

HIGH POWER DENSITY CHIPS BASED TWO-PHASE LOOP RECIRCULATION

FIELD OF THE INVENTION

Embodiments of the present disclosure relate generally to electronics cooling, chip and server cooling hardware, and liquid cooling. More particularly, embodiments of the disclosure relate to high power density chips based two-phase loop recirculation.

BACKGROUND

Electronics cooling is very important for computing hardware and other electronic devices, such as central processing unit (CPU) servers, graphics processing unit (GPU) servers, storage servers, networking equipment, edge and mobile systems, on-vehicle computing boxes, and so on. These systems and devices are critical for businesses, as they are the fundamentals of a company's daily business operation. The designs of the hardware components and electronics packaging need to improve to continuously support the requirements. Cooling of these electronic components has also become quite challenging to ensure they are functioning properly due to the constant provision of design thermal environments. Moreover, the majority of the electronics enclosures and packages introduce different critical thermal challenges which can require significant research and development efforts on designing and identifying cooling system customizations.

Furthermore, thermal management is becoming significantly critical for high performance processors. In some cases, it also impacts on computing technology development and innovation. With better thermal management solutions, the design of processors can be upgraded to higher power and more cores, which continues to be operated under the thermal specifications, even with stricter thermal requirements.

There are much effort on developing more effective and efficient thermal management solutions and techniques, however, it is still a challenge for managing the ever increasing power densities of the chips and server packages. Some of the existing cooling systems for server liquid cooling with multiple high power density chips are either single phase liquid cooling or phase changing liquid cooling is a promising technique for such challenges. However, these solutions require more efficient design and management techniques for high power density chips and packages, particularly for a server printed circuit board (PCB) layout with multiple chips.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure provide an electronic cooling loop and cooling hardware for critical processors and chips thermal management. The design aims to enable high efficiency energy and fluid management for operating high power density chips packaging on a same PCB close to one another. Embodiments of the design described herein include, but not limited to, high power density thermal management for critical processors and processors having constantly increasing power density, high reliability, ease of integration and accommodation of different chips and servers, ease of manufacture, segregation of cooling capacity, enablement of different system designs and fluid managements, and enablement of simplified control design for a two phase coolant.

In some embodiments, the design includes a cooling plate running with two phase coolant loop. The cooling plate may be connected with a vapor separator before outlet fluid is delivered to a secondary cooling plate. The vapor separator may be connected with a return unit assembled on the top to transport vapor. A last cooling plate in the loop may be connected to the return unit through its outlet port. The return unit outlet may pump the fluid out from the return unit. The return unit may include one or more structures for enhancing the separation of the liquid and vapor and ensure only vapor being pumped out from the return unit. In an embodiment, the return unit includes porous structure and/or a fluid resistance part.

According to a first aspect, an electronic cooling system is provided. The electronic cooling system may include a plurality of cooling plates to extract heat from their respective heat sources. The system may further include one or more vapor separators. Each vapor separator may receive mixed phase liquid and separate the mixed phase liquid into vapor and cooling liquid. The system may further include a return unit to receive the vapors from the vapor separators through one or more vapor loops, resist any fluid that travels within a vapor dissipation portion of the return unit to an outlet of the return unit, and dissipate the received vapors.

In an embodiment, the cooling plates may include a first cooling plate that may receive liquid phase cooling liquid to extract heat from a first heat source and produce first mixed phase liquid having a vapor phase and a liquid phase. The cooling plates may further include a second cooling plate that may receive cooling liquid from a vapor separator, use the cooling liquid from the vapor separator to extract heat from a second heat source, produce second mixed phase liquid having a vapor phase and a liquid phase, and supply the second mixed phase liquid to the return unit.

According to a second aspect, a system is provided where the system may include a server having a plurality of heat sources, and an electronic cooling apparatus packaged with the server. The electronic cooling apparatus may include a plurality of cold plates to extract heat from the heat sources, respectively. The apparatus may further include a plurality of vapor separators. Each vapor separator may receive mixed phase liquid and separate the mixed phase liquid into vapor and cooling liquid. The apparatus may further include a return unit that may receive the vapors from the vapor separators through a plurality of vapor loops, and dissipate the received vapors.

In an embodiment, the cold plates may include a first cold plate that may receive liquid phase cooling liquid through an inlet to extract heat from a first heat source and produce first mixed phase liquid having a vapor phase and a liquid phase. The cold plates may further include a second cold plate that may receive cooling liquid from a vapor separator, use the cooling liquid from the vapor separator to extract heat from a second heat source, produce second mixed phase liquid having a vapor phase and a liquid phase, and supply the second mixed phase liquid to the return unit.

Figure 1:
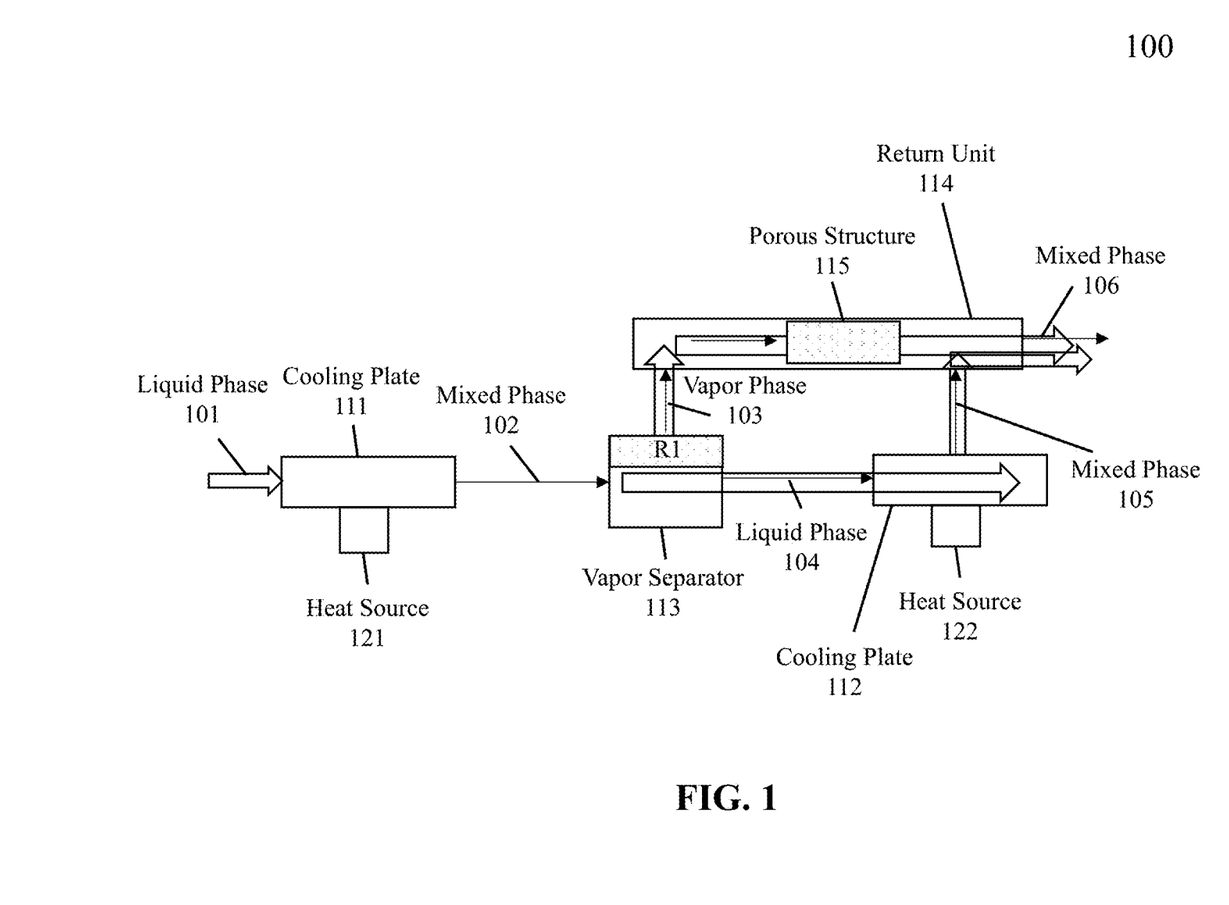
FIG. 1 is a schematic diagram illustrating an example design of a two-phase loop recirculation according to an embodiment.

FIG. 1 is a block diagram illustrating an example design of a two-phase loop recirculation according to an embodiment. Referring to FIG. 1, design 100 may include, but not limited to, cooling plates 111-112, vapor separator 113, and return unit 114. Cooling/cold plate 111 may receive liquid phase cooling liquid 101, such as coolant, to extract heat from heat source 121. Heat emitted from heat source 121 may be transferred to or mixed with the cooling liquid 101 (e.g., dissipation) to produce or transform into mixed phase liquid 102 (e.g., two-phase mixed liquid). The mixed phase liquid 102 is supplied to a vapor separator 113, through a separation loop, for separating the mixed phase liquid 102 into its constituent phases (vapor phase 103 and liquid phase 104).

In an embodiment, vapor separator 113 may introduce resistance (R1) in an upward path so that the vapor phase 103 of the mixed phase liquid 102 can arise or be guided upwardly towards return unit 114 through a vapor loop while the liquid phase 104 of the mixed phase liquid 102 can be guided to flow towards cooling/cold plate 122 to extract heat from heat source 122. Heat emitted from heat source 122 may be transferred to or mixed with liquid phase cooling liquid 104 and transformed into mixed phase liquid 105, which is supplied to return unit 114 in the design 100 of FIG. 1. In some embodiments, heat sources 121-122 can be any electronic system, such as a chip, processor, system on a chip (SoC) package, application-specific integrated circuit (ASIC), etc.

With continued reference to FIG. 1, vapor phase (or vapor) 103 may be provided or guided to a porous structure 115 included in return unit 114. Porous structure 115 generally has low thermal conductivity and thus, it may be used for dissipation of vapor 103 to produce cool/dissipated vapor that can be mixed with mixed phase liquid 105 at or within return unit 114 to generate mixed phase liquid 106. In an embodiment, the mixed phase liquid 106 may be supplied back or returned to the cooling plate 111 through a return loop (not shown) after running through a cooler or condenser (not shown). In an embodiment, the cooler can be server level unit, in an embodiment, the cooler is a facility level cooler.

Accordingly, in FIG. 1, design 100 uses a separation loop for vapor and liquid in a single thermal recirculation loop to ensure only cooling liquid is supplied to cooling plates 111-112. The design utilizes the characteristics of the vapor in a mixed loop to separate the vapor from the liquid, particularly in cases of multiple cooling plates for multiple heat generating chips in a series loop. Moreover, in some embodiments, the design introduces fluid pressure for the liquid flow to guide the liquid flow through various designed areas. In an embodiment, the design utilizes density change of the vapor to guide the vapor in the separation loop.

Figure 2:
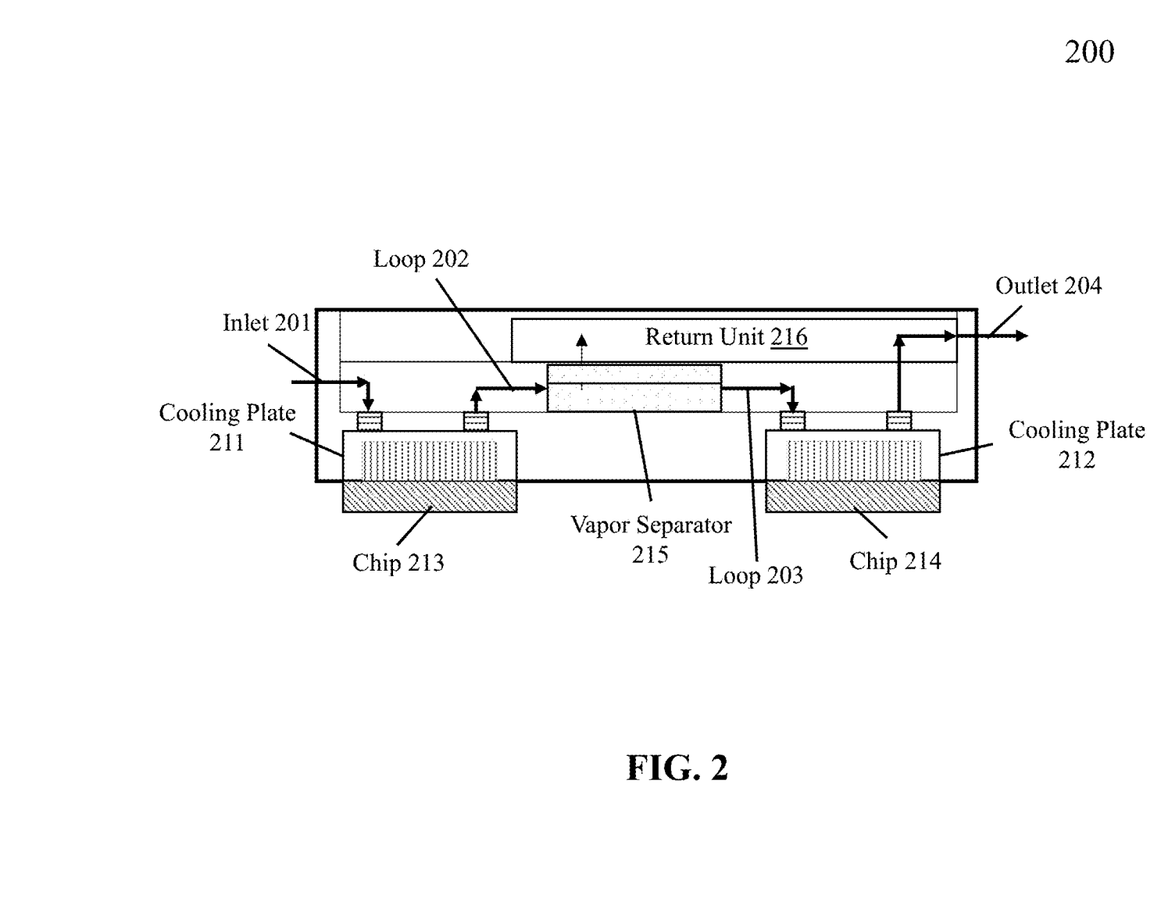
FIG. 2 is a block diagram illustrating an example design of a two-phase loop recirculation having a vapor separator stacked underneath a vapor return unit according to an embodiment.

FIG. 2 is a block diagram illustrating an example design of a two-phase loop recirculation having a vapor separator stacked underneath a vapor return unit according to an embodiment. In FIG. 2, design 200 may include, but not limited to, cooling/cold plates 211-212, chips 213-214, vapor separator 215, and return unit 216.

In an embodiment, cooling liquid (e.g., coolant) may be supplied to cooling plate 211 through inlet 201 of the cooling plate 211 to extract heat from chip 213 disposed underneath the cooling plate 211. Chip 213 may be in proper thermal contact with cooling plate 211 and may be packaged or integrated with the cooling plate 211. The vapor produced by chip 213 may be transferred to the cooling liquid to produce or transform into a mixed phase liquid (e.g., two-phase mixed liquid) that is designed to be managed to enter to a vapor separator 215 after passing through an outlet of cooling plate 211 and separator loop 202.

In an embodiment, vapor separator 215 serves to separate the mixed phase liquid into a vapor phase and a liquid phase. Similar to vapor separator 113 of FIG. 1, vapor separator 215 may introduce a resistance in a particular direction (e.g., upward direction) so that the vapor phase (or vapor) of the mixed phase liquid can be guided towards return unit 216 through a vapor loop while the liquid phase of the mixed phase liquid can be guided to flow towards an inlet of the cooling/cold plate 212, through cooling loop 203, to extract heat generated by chip 214. As shown, chip 214 is disposed underneath cooling plate 212 and may be in thermal contact with the cooling plate 212. In an embodiment, the chip 214 may be packaged or integrated with the cooling plate 212.

Still referring to FIG. 2, the heat contained in vapor emitted from chip 214 may be transferred to or mixed with the liquid phase of the mixed phase liquid (e.g., dissipation), produced by vapor separator 215, to generate or transform into a mixed phase liquid that is supplied to return unit 216 through an outlet of the cooling plate 212. In an embodiment, the return unit 216 may dissipate the vapor received from the vapor separator 215 to produce cool/dissipated vapor, and the dissipated vapor can be mixed with the mixed phase liquid (from the cooling plate 212) at or within return unit 216 to generate another mixed phase liquid that may have a temperature lower than that of the mixed phase liquid produced by the cooling plate 212 (due to the dissipated vapor cooling the mixed phase liquid from the cooling plate 212). In an embodiment, the mixed phase liquid generated by the return unit 216 may be supplied back or returned to the cooling plate 211 through outlet 204 of the return unit 216.

It is noted that while design 200 illustrates two cooling plates 211-212, any number of cooling plates connected or coupled in a series loop may be utilized in design 200. As shown, in design 200, the vapor separator 215 is disposed underneath the return unit 216, and they may be integrated together as a single structure/unit in some embodiments. In an embodiment, the last cooling plate (e.g., cooling plate 212) may include an outlet connected to a vapor area or portion of the return unit 216. In this embodiment, only vapor may be produced and guided through that outlet of the last cooling plate.

Figure 3:
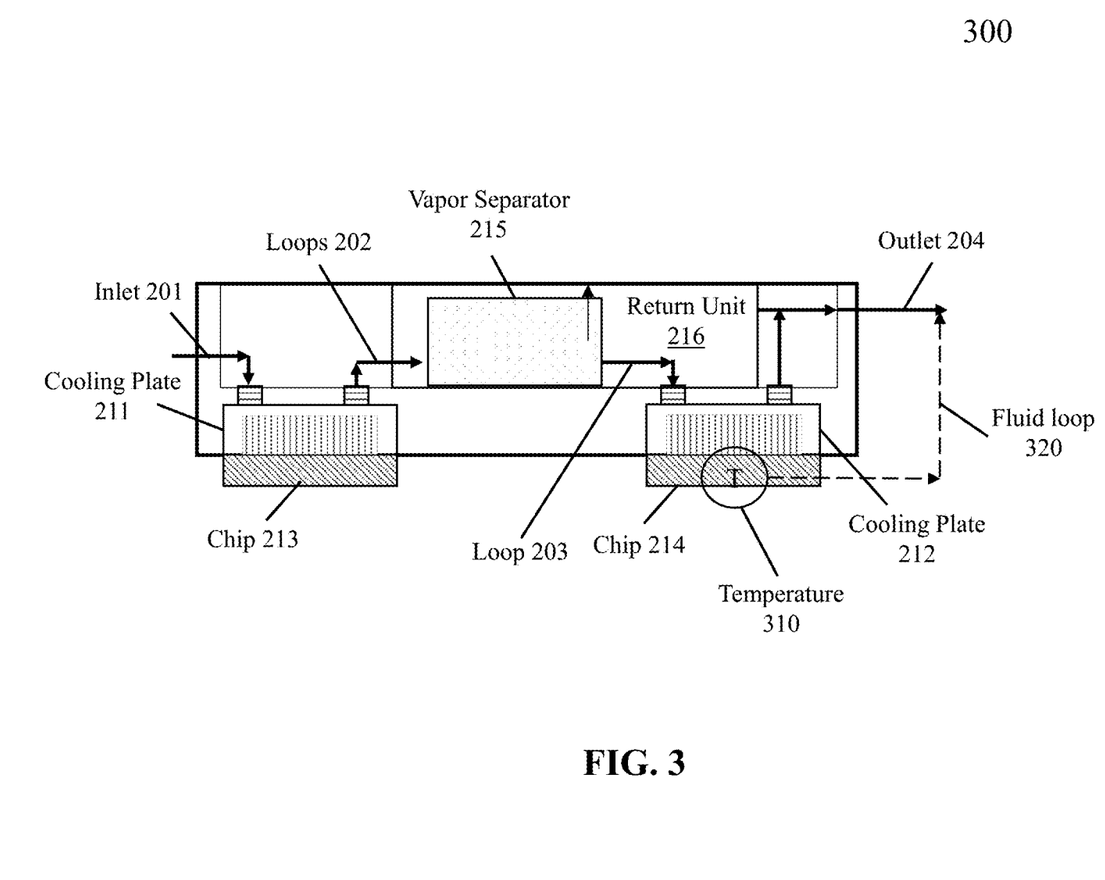
FIG. 3 is a block diagram illustrating an example design of a two-phase loop recirculation having a return unit and a vapor separator packaged as one unit according to an embodiment.

FIG. 3 is a block diagram illustrating an example design of a two-phase loop recirculation having a return unit and a vapor separator packaged as one unit according to an embodiment. In FIG. 3, design 300 is similar to design 200 of FIG. 2 and for brevity sake, the similar components and their associated functions will not be described again.

In design 300, however, vapor separator 215 and return unit 216 can be packaged as one unit/structure, and vapor separator 215 may be disposed within return unit 216, in some embodiments. Therefore, the functions of the vapor separator 215 and the return unit 216, as previously described, can be integrated together in the packaged single unit/structure. Furthermore, in design 300, temperature 310 of the last cooling plate (e.g., cooling plate 212) may be used to control an overall fluid loop 320. For example, based on the temperature 310 of chip 214, cooling plate 212 can control or regulate the flow rate of the fluid/liquid being output through an overall fluid loop 320. The output fluid, through fluid loop 320, may be combined with the mixed phase liquid produced at outlet 204 (i.e., dissipated vapor from return unit 216 combined with mixed phase fluid produced by cooling plate 212). In an embodiment, the temperature is a chip temperature such as case temperature, in an embodiment, the temperature can be cooling plate temperature measured at the cooling plate.

Figure 4:
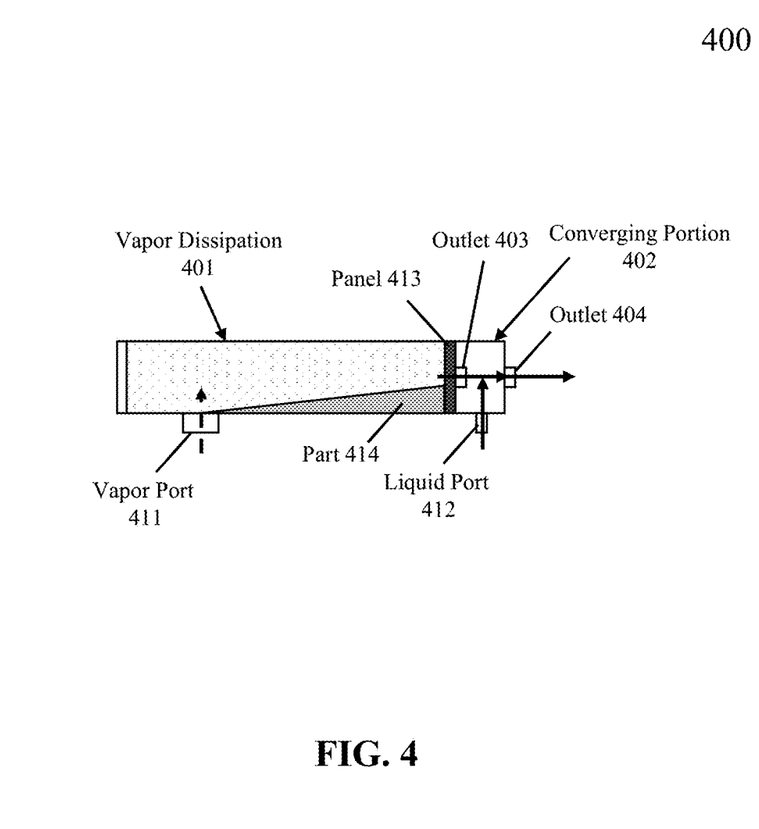
FIG. 4 is a block diagram illustrating an example return unit according to an embodiment.

FIG. 4 is a block diagram illustrating an example return unit according to an embodiment. In some embodiments, return unit 400 may be return unit 114 of FIG. 1 or return unit 216 of FIGS. 2-3. Referring to FIG. 4, return unit 400 may include, but not limited to, a vapor dissipation portion 401, a converging portion 402, and a panel 413 for separating the vapor dissipation portion 401 from the converging portion 402.

As shown, vapor dissipation portion 401 and converging portion 402 may include a vapor port 411 and a liquid port 412, respectively, so that the return unit 400 can separately receive vapor and liquid. In an embodiment, vapor port 411 is operable for receiving vapor, for example from a vapor separator such as vapor separator 113 or 215 previous described, and vapor dissipation portion 401 is operable to dissipate that received vapor. For example, vapor dissipation portion 401 may include a porous structure (e.g., porous structure 115 of FIG. 1) that effectively dissipates the received vapor based on the vapor's characteristics to produce cool/dissipated vapor. In an embodiment, portion 401 may further include a liquid resistance part 414 to resist or prevent any excess liquid in portion 401 to flow towards the direction of panel 413 and through vapor outlet 403 of the converging portion 402. In an embodiment, part 414 may extend from vapor port 411 to panel 413, and slope upwardly from vapor port 411 to panel 413.

Still referring to FIG. 4, converging portion 402 may receive mixed phase liquid, for example from a cooling plate, such as cooling plate 112/212, through liquid port 412, and the dissipated vapor through the outlet 403. The mixed phase liquid and the dissipated vapor may converge and mix with one another in converging portion 402 to produce another mixed phase liquid that flows out through fluid outlet 404 of the converging portion 402. As previously described, this mixed phase liquid may be supplied back to a cooling plate (e.g., cooling plate 111/211) through a return loop. It is noted that while return unit 400 is shown to have one vapor port and one liquid port, in some embodiments, return unit 400 may include multiple vapor ports and multiple liquid ports for support of a number of vapor separators (as described in more detail herein below with respect to FIG. 5).

Figure 5:
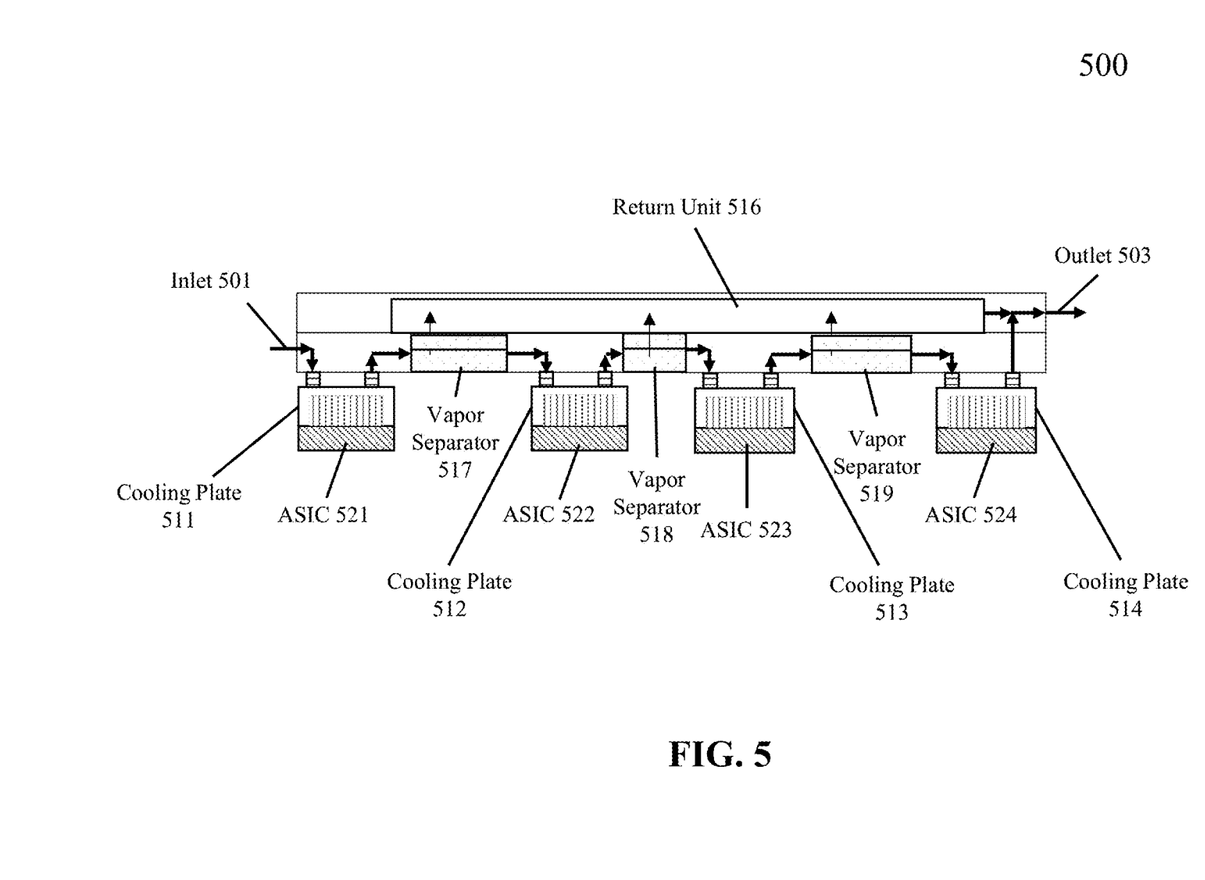
FIG. 5 is a block diagram illustrating an example assembly having multiple cooling plates that are assembled to cool multiple chips according to an embodiment.

FIG. 5 is a block diagram illustrating an example assembly having multiple cooling plates that are assembled to cool multiple chips according to an embodiment. In FIG. 5, assembly 500 includes, but not limited to, cooling/cold plates 511-514 for cooling ASICs 521-524, respectively, vapor separators 517-519 (which may be similar to or same as any of the vapor separators previously described), and a return unit 516 (which may be similar to or same as any of the return units previously described).

Cooling plate 511 may receive liquid phase cooling liquid (e.g., coolant), through inlet 501 of the cooling plate 511, to extract heat generated by ASIC 521. Heat is extracted and contained within the vapor as latent heat. The vapor containing the heat extracting from ASIC 521 is mixed with the cooling liquid forming first mixed phase liquid (e.g., two-phase mixed liquid). The first mixed phase liquid may be supplied to vapor separator 517 through a first separation loop, for example.

Vapor separator 517 serves to separate the first mixed phase liquid into its vapor phase and its liquid phase. The vapor phase of the first mixed phase liquid can be guided towards return unit 516 while the liquid phase of the first mixed phase liquid can be guided to flow towards an inlet of the cooling plate 512.

Cooling plate 512 may receive the liquid phase of the first mixed phase liquid to extract heat generated by ASIC 522. The heat contained in vapor emitted by ASIC 522 may be transferred to or mixed with the liquid phase cooling liquid to produce second mixed phase liquid. The second mixed phase liquid may be supplied to vapor separator 518, for example, through a second separation loop.

Vapor separator 518 serves to separate the second mixed phase liquid into its vapor phase and its liquid phase. The vapor phase of the second mixed phase liquid may also be guided towards the return unit 516 while the liquid phase of the second mixed phase liquid may be guided to flow towards an inlet of the cooling plate 513.

Cooling plate 513 may receive the liquid phase of the second mixed phase liquid to extract heat generated by ASIC 523. The heat contained in vapor emitted by ASIC 523 may be transferred to or mixed with the liquid phase cooling liquid to produce third mixed phase liquid. The third mixed phase liquid may be supplied to vapor separator 519, for example, through a third separation loop.

Vapor separator 519 serves to separate the third mixed phase liquid into its vapor phase and its liquid phase. The vapor phase of the third mixed phase liquid may also be guided towards the return unit 516 while the liquid phase of the third mixed phase liquid may be guided to flow towards an inlet of the cooling plate 514.

Cooling plate 514 may receive the liquid phase of the third mixed phase liquid to extract heat generated by ASIC 524. The heat contained in vapor emitted by ASIC 524 may be transferred to or mixed with the liquid phase cooling liquid to produce fourth mixed phase liquid. The fourth mixed phase liquid may converge and combine with dissipated vapor produced by return unit 516 to form fifth mixed phase liquid that may be returned to inlet 501 through a return loop. In some embodiments, the temperature of the fifth mixed phase liquid is lower than that of the fourth mixed phase liquid due to the dissipated vapor cooling the fourth mixed phase liquid.

In an embodiment, return unit 516 may dissipate the vapors received from vapor separators 517-519 to produce the dissipated vapor. For example, return unit 516 may include one or more porous structures that can effectively dissipate the vapor/heat produced from each of the vapor separators 517-519.

Accordingly, the assembly 500 of FIG. 5 can be used to efficiently build multiple cooling plates (e.g., cooling plates 511-514) in a series loop with mixed phase liquid (e.g., two-phase coolant). As shown, ASICs 521-524 are respectively disposed underneath cooling plates 511-514 and may be in proper thermal contact with the cooling plates 511-514. In an embodiment, each of the ASICs 521-524 may be respectively packaged or integrated with its corresponding cooling plate.

Figure 6:
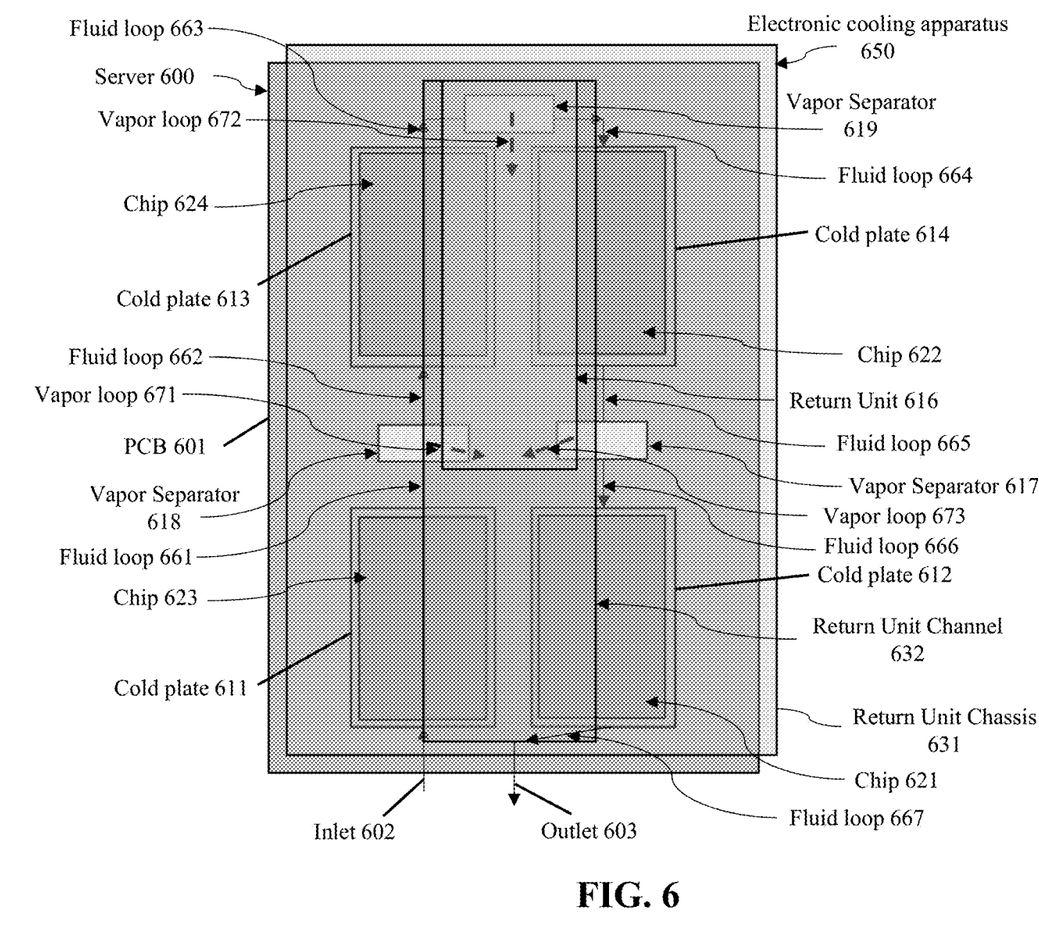
FIG. 6 is a top view illustrating a server having multiple chips packaged with an electronic cooling apparatus according to an embodiment.

FIG. 6 is a block diagram illustrating a server having multiple chips packaged with an electronic cooling apparatus according to an embodiment. In FIG. 6, server 600 includes, but not limited to, a PCB 601 having a multiplicity of chips 621-624. Electronic cooling apparatus 650 includes, but not limited to, a return unit chassis 631 for supporting cooling/cold plates 611-614, vapor separators 617-619, and a return unit 616. In some embodiments, server 600 may be packaged with cooling apparatus 650.

Referring to FIG. 6, cooling fluid may be supplied to inlet 602 and received by cold plate 611 that is disposed on top of chip 623. The heat contained in vapor emitted from chip 623 may be extracted by the cooling fluid by transferring to the cooling fluid to produce first mixed phase fluid (e.g., two-phase coolant) through fluid loop 661. Vapor separator 618 may receive and separate the first mixed phase fluid into its vapor phase and its liquid phase. The vapor phase of the first mixed phase fluid is provided or guided towards return unit 616 through vapor loop 671 while the liquid phase of the first mixed phase fluid is provided to cold plate 613 through fluid loop 662.

The cold plate 613 utilizes the liquid phase of the first mixed phase fluid to extract the heat emitted from chip 624 disposed underneath. In doing so, the heat contained in vapor emitted from the chip 624 may be transferred to the liquid phase to produce second mixed phase fluid. Vapor separator 619 may receive the second mixed phase fluid through fluid loop 663, and separate the second mixed phase fluid into its vapor phase and its liquid phase. The vapor phase of the second mixed phase fluid is guided towards return unit 616 through vapor loop 672 while the liquid phase of the second mixed phase fluid is provided to cold plate 614 through fluid loop 664.

Cold plate 614 utilizes the liquid phase of the second mixed phase fluid to extract heat generated by chip 622 disposed underneath. The heat contained in vapor emitted from chip 622 may be transferred to the liquid phase to generate third mixed phase fluid that can be supplied to vapor separator 617 through fluid loop 665. Vapor separator 617 may receive the third mixed phase fluid through the fluid loop 665 and separate the third mixed phase fluid into its vapor phase and liquid phase. The vapor phase may be guided towards the return unit 616 through vapor loop 673, while the liquid phase may be guided to flow towards cold plate 612 through fluid loop 666.

Cold plate 612 utilizes the liquid phase of the third mixed phase fluid to extract heat emitted from chip 621 disposed underneath, and in doing so, the heat contained in vapor generated by the chip 621 may be transferred to the liquid phase and produced fourth mixed phase fluid that flows through fluid loop 667. The fourth mixed phase fluid may converge and combine with dissipated vapor generated by return unit 616 to produce fifth mixed phase fluid that flows out of outlet 603 of the return unit chassis 631. In some embodiments, the fifth mixed phase fluid may be supplied back or returned to inlet 602. In an embodiment, as the fifth mixed phase fluid is cooled by the dissipated vapor, it has a lower temperature as compared to that of the fourth mixed phase fluid. Outlet 603 and inlet 602 may connect to an external cooling loop which including the vapor cooler.

In an embodiment, return unit 616 may dissipate the vapor phases received from vapor separators 617-619 to produce the dissipated vapor through return unit channel 632. For example, return unit 616 may include one or more porous structures that introduce resistance to effectively dissipate the vapor/heat produced from each of the vapor separators 617-619. In some embodiments, return unit 616 may be any of the previously described return units, and for brevity sake, it will not be described again herein.

Figure 7:
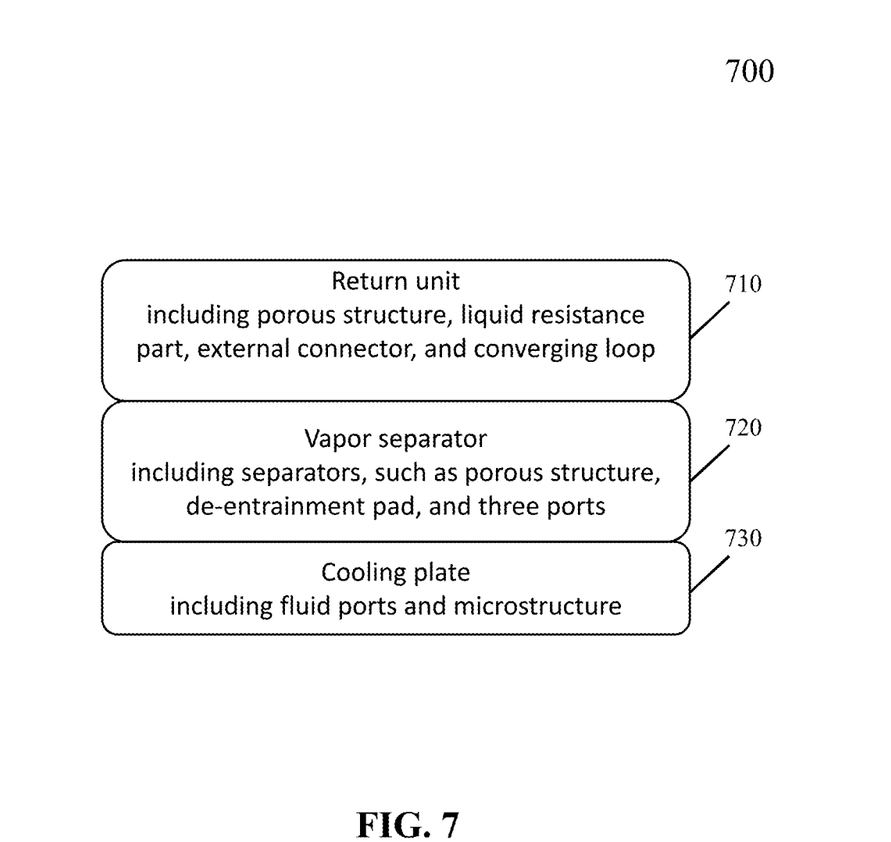
FIG. 7 is a block diagram illustrating a stacking structure for designing, developing and packaging a liquid cooling system according to an embodiment.

FIG. 7 is a block diagram illustrating a stacking structure for designing, developing and packaging a liquid cooling system according to an embodiment. Referring to FIG. 7, stacking structure 700 may include stacking layers 710-730. The top layer 710 may include a return unit that includes a porous structure, a liquid resistance part, an external connector, and a converging loop. The middle layer 720 may include a vapor separator that includes one or more separators (e.g., porous structure), de-entrainment pad, and three ports. The bottom layer 730 may include a cooling plate that includes fluid ports and one or more microstructures forming cooling fluid flowing path and extending heat contacting area.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic cooling system, comprising:
a plurality of cooling plates to extract heat from their respective heat sources;
one or more vapor separators, each of the one or more vapor separators to receive mixed phase fluid and separate the mixed phase fluid into a vapor and a cooling liquid; and
a return unit to receive the vapor from each of the one or more vapor separators through one or more vapor loops, resist liquids that travel within a vapor dissipation portion of the return unit to a vapor outlet of the return unit, and dissipate the received vapor from the vapor dissipation portion of the return unit;
wherein the plurality of cooling plates comprise:
a first cooling plate that receives a first cooling liquid to extract the heat from a first heat source among the respective heat sources, produces a first mixed phase fluid, and supplies the first mixed phase fluid to a first vapor separator among the one or more vapor separators, and a second cooling plate that receives a second cooling liquid from the first vapor separator, uses the second cooling liquid from the first vapor separator to extract the heat from a second heat source among the respective heat sources, produces a second mixed phase fluid, and supplies the second mixed phase fluid to the return unit or to a second vapor separator among the one or more vapor separators.

2. The electronic cooling system of claim 1, wherein the dissipated vapor from the vapor dissipation portion of the return unit and the second mixed phase liquid converge within the return unit to form a third mixed phase fluid.

3. The electronic cooling system of claim 2, wherein the return unit includes a fluid outlet for output of the third mixed phase fluid through a return loop.

4. The electronic cooling system of claim 1, wherein the one or more vapor separators are disposed external to the return unit or within the return unit.

5. The electronic cooling system of claim 4, wherein the one or more vapor separators and the return unit are integrated or packaged as a single structure.

6. The electronic cooling system of claim 1, wherein the return unit includes one or more vapor ports to receive the vapor from each of the one or more vapor separators and a fluid port to receive the second mixed phase fluid supplied by the second cooling plate.

7. The electronic cooling system of claim 1, wherein each of the plurality of cooling plates is connected to at least one of the one or more vapor separators.

8. The electronic cooling system of claim 7, wherein each of the one or more vapor separators is connected in between a pair of cooling plates among the plurality of cooling plates.

9. The electronic cooling system of claim 7, wherein an outlet fluid loop of the second cooling plate is connected to the return unit.

10. The electronic cooling system of claim 1, wherein based on a temperature of the second heat source, the second cooling plate regulates a flow rate of the second mixed phase fluid that bypasses the return unit through an overall fluid loop.

11. A system, comprising:
a server having a plurality of heat sources; and
an electronic cooling apparatus packaged with the server, the electronic cooling apparatus including:
a plurality of cold plates to extract heat from the heat sources, respectively;
a plurality of vapor separators, each of the vapor separators to receive mixed phase fluid and separate the mixed phase fluid into a vapor and a cooling liquid; and
a return unit to receive the vapor from each of the vapor separators through a plurality of vapor loops, and dissipate the received vapor from a vapor dissipation portion of the return unit;
wherein the plurality of cold plates comprise:
a first cold plate that receives a first cooling liquid through an inlet of the electronic cooling apparatus to extract the heat from a first heat source among the heat sources, produces a first mixed phase fluid, and supplies the first mixed phase fluid to a first vapor separator among the plurality of vapor separators, and
a second cold plate that receives a second cooling liquid from the first vapor separator, uses the second cooling liquid from the first vapor separator to extract the heat from a second heat source among the heat sources, produces a second mixed phase fluid, and supplies the second mixed phase fluid to the return unit or to a second vapor separator among the plurality of vapor separators.

12. The system of claim 11, wherein the electronic cooling apparatus further includes a return unit chassis that supports the cold plates, the vapor separators, and the return unit.

13. The system of claim 11, wherein the vapor separators are disposed external to the return unit or within the return unit.

14. The system of claim 13, wherein the vapor separators and the return unit are integrated or packaged as a single structure.

15. The system of claim 11, wherein the dissipated vapor from the vapor dissipation portion of the return unit and the second mixed phase fluid converge within the return unit to form a third mixed phase fluid.

16. The system of claim 15, wherein the return unit includes a fluid outlet for output of the third mixed phase fluid through a return loop.

17. The system of claim 16, wherein the cold plates, the vapor separators, the return unit, the inlet of the electronic cooling apparatus, and the fluid outlet of the return unit are connected through a plurality of fluid loops.

18. The system of claim 11, wherein the return unit includes a plurality of vapor ports to receive the vapor from the vapor separators and a liquid port to receive the second mixed phase fluid supplied by the second cold plate.

19. The system of claim 11, wherein each of the vapor separators is connected in between a pair of cold plates among the plurality of cold plates.

20. The system of claim 19, wherein the second mixed phase fluid from an outlet of the second cold plate converges with the received vapor from a vapor outlet of the vapor dissipation portion of the return unit.

* * * * *